United States Patent
Yamauchi et al.

(10) Patent No.: US 6,246,627 B1
(45) Date of Patent: Jun. 12, 2001

(54) SEMICONDUCTOR DEVICE CAPABLE OF CUTTING OFF A LEAKAGE CURRENT IN A DEFECTIVE ARRAY SECTION AND METHOD THEREOF

(75) Inventors: Hiroyuki Yamauchi, Takatsuki; Hironori Akamatsu, Hirakata; Toru Iwata, Osaka; Keiichi Kusumoto, Nishinomiya; Satoshi Takahashi, Hirakata; Yutaka Terada, Osaka; Takashi Hirata, Neyagawa, all of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/397,239

(22) Filed: Sep. 16, 1999

Related U.S. Application Data (62) Division of application No. 09/014,775, filed on Jan. 28, 1998.

(30) Foreign Application Priority Data

Jan. 31, 1997 (JP) .................................................. 9-019436

(51) Int. Cl.[7] ...................................................... G11C 5/14
(52) U.S. Cl. .......................... 365/229; 365/228; 365/227; 365/226; 365/195; 365/200; 365/225.7; 365/230.03
(58) Field of Search ................................. 365/200, 225.7, 365/230.03, 226, 228, 227, 195, 229

(56) References Cited

U.S. PATENT DOCUMENTS

| | | | |
|---|---|---|---|
| 5,355,331 | 10/1994 | Takase et al. | 365/154 |
| 5,473,573 | 12/1995 | Rao | 365/230.01 |
| 5,666,315 | 9/1997 | Tsukude et al. | 365/200 |
| 5,673,231 | 9/1997 | Furutani | 365/203 |
| 5,724,297 | 3/1998 | Noda et al. | 365/226 |
| 5,843,799 | 12/1998 | Hsu et al. | 438/6 |
| 5,896,334 | 4/1999 | Casper et al. | 365/202 |
| 5,926,430 | 7/1999 | Noda et al. | 365/226 |

FOREIGN PATENT DOCUMENTS

| | | | |
|---|---|---|---|
| 62-188100 * | 8/1987 | (JP) | G11C/17/00 |
| 6068694 | 3/1994 | (JP) | G11C/29/00 |
| 6076593 | 3/1994 | (JP) | G11C/29/00 |
| 8297993 | 11/1996 | (JP) | G11C/29/00 |

* cited by examiner

*Primary Examiner*—Andrew Q. Tran
(74) *Attorney, Agent, or Firm*—Renner, Otto, Boisselle & Sklar (57) ABSTRACT

The semiconductor device of this invention includes: an array section including a plurality of circuit blocks; a leakage current cutoff section for cutting off a leakage current occurring in at least one of the plurality of circuit blocks in the array section; and a control section for controlling the leakage current cutoff section in accordance with leakage current cutoff information.

12 Claims, 9 Drawing Sheets

SEMICONDUCTOR DEVICE CAPABLE OF CUTTING OFF A LEAKAGE CURRENT IN A DEFECTIVE ARRAY SECTION AND METHOD THEREOF

This application is a divisional of U.S. Ser. No. 09/014,775, filed Jan. 28, 1998, now allowed.

BACKGROUND OF THE INVENTION

1. Field of the Invention

The present invention relates to a semiconductor device including an array section having a plurality of circuit blocks and a method for controlling such a semiconductor device. More particularly, the present invention relates to a semiconductor device having a function of cutting off a leakage current occurring in the array section for every circuit block individually.

2. Description of the Related Art

A redundant design technique (the defect compensation technique) has been employed to prevent the yield of a large-scale integration circuit (LSI) from decreasing due to random defects which may occur in the LSI during the semiconductor fabrication process. In the redundant design technique, a redundancy is established in the circuit configuration so that an occurrence of a small number of defects will not damage the function of the whole LSI. Such a redundant design technique is especially applied to memories.

For example, in memories such as a random access memory (RAM) and an erasable programmable read only memory (EPROM), a spare memory cell array is prepared in addition to a predetermined memory cell array (the main memory cell array). If a defect occurs in a portion of the main memory cell array, the spare memory cell array is used in place of the defective portion of the main memory cell array.

Such defect compensation under the redundant circuit design is realized by a fixed write method or a tester mounting method. In the fixed write method, a pre-mounted wafer is screened by an external tester in the fabrication stage. If a defective portion (e.g., a defective memory cell which does not normally operate) is found as a result of the screening, switching of the defective portion to a redundant circuit (e.g., a spare memory cell array or memory block) is accomplished. This switching includes, for example, cutting a programmable read only memory (PROM) wiring by applying a current or irradiating with laser light. The switching is accomplished by hardware at the final stage of the fabrication process and improves the production yield.

The screening for defective memory cells in the redundant circuit design is a so-called destructive test which is performed by an external tester during the fabrication process (i.e., for a pre-mounted wafer) by applying a voltage higher than a normal operational voltage to the wafer. Therefore, in the case where a control circuit portion (such as a chip logic) is formed on one chip together with a memory circuit, the control circuit portion may be adversely affected by the screening. Moreover, devices mounted on the chip need to have a durability against the screening voltage. To avoid these problems, the tester mounting method is often employed, where a tester for detecting a defective memory cell is mounted on each chip to avoid the screening.

In the tester mounting method, an internal tester mounted in an LSI is used for detecting a defective memory cell, and to switch the defective memory cell to a redundant circuit based on the test result if necessary. Such a test is automatically performed when the device is turned on (self-checking). The test result is stored in a volatile memory and the switching is accomplished by software.

The registration of the switching will be described more specifically using the case of the fixed write method as an example.

The switching of a defective portion and a spare memory cell array described above can be accomplished by a current fuse method, a laser fuse method, a method where high-resistance polysilicon is short-circuited by laser irradiation, a method where a polysilicon diode is short-circuited, and the like. In the current fuse method, a PROM fuse (made of polysilicon, for example) is melted (thereby "blowing" the fuse) by Joule heating generated by current flow. In the laser fuse method, a PROM fuse (made of polysilicon, for example) is melted by spot irradiation with a laser beam. In this method, a laser-blown type fuse ROM is used. If a defective memory cell is found during testing, the position of the fuse to be cut off (the "cut-off" fuse) is determined from the address of the defective memory cell. Based on the determined position information, the position of the laser beam irradiation is controlled so as to melt the fuse. The information regarding the state of the defective memory cell is thus written in the fuse ROM. With this information, when a line corresponding to the cutoff fuse is accessed, the line is connected to the spare memory cell array, not to the main memory cell array, thereby accomplishing the switching. Thus, the element which switches the defective element to the spare element functions as a decoder.

In the tester mounting method, as in the fixed write method, the test result from the internal tester is stored in a volatile memory, and the access is switched to the spare memory cell array depending on the stored test result. For example, the addresses of defective memory cells are stored, and the address of a memory cell which is requested for accessing is compared with the stored addresses of the defective memory cells. When it is determined that one of the defective memory cells is requested for accessing, the spare memory cell array (the redundant memory cell array), not the main memory cell array, is accessed. This prohibits the access to any defective memory cell or the memory cell array including the defective memory cell, and instead allows for the access to the redundant memory cell array.

Thus, in the redundant circuit design as described above, the defect compensation is realized by prohibiting the access to a defective memory cell and switching to a replacement cell. This successfully compensates the memory function of the defective memory cell in the main memory cell array. However, there arises a problem when a leakage current occurs from a defective memory cell in the memory cell array due to, for example, a short circuit in the defective memory cell or gate floating by the cutting of the defective memory cell. In such a case, though the access to the defective memory cell is prohibited, a defective status of the memory cell array due to the leakage current cannot be compensated for because the defective memory cell is kept electrically connected with the power source. Such a leakage current is not detected even in the self-checking described above. Moreover, a leakage current may sometimes occur in a memory cell which is effective in the memory function and is not necessarily defective.

When such a leakage current is present in the semiconductor device, waste power is consumed. This wasteful power consumption due to the leakage current creates a critical problem especially in a portable information apparatus where a secondary battery is used for back-up operation, for example. In such a case, system failure may possibly arise due to the leakage current.

SUMMARY OF THE INVENTION

The semiconductor device of this invention includes: an array section including a plurality of circuit blocks; a leakage current cutoff section for cutting off a leakage current occurring in at least one of the plurality of circuit blocks in the array section; and a control section for controlling the leakage current cutoff section in accordance with leakage current cutoff information.

In one embodiment of the invention, the leakage current cutoff section cuts off the leakage current by electrically insulating at least one of the plurality of circuit blocks from a-power source which supplies electric power to the array section.

In another embodiment of the invention, the leakage current cutoff section includes: a switching element disposed between a power source which supplies electric power to the array section and one of the plurality of circuit blocks; and a programmable logic element connected to the switching element, and the control section controls an ON/OFF state of the switching element by programming the programmable logic element in accordance with the leakage current cutoff information.

In still another embodiment of the invention, the leakage current cutoff information includes identification information for identifying at least one circuit block to be electrically insulated from the power source.

In still another embodiment of the invention, the leakage current cutoff section includes a fuse disposed between a power source which supplies electric power to the array section and one of the plurality of circuit blocks, and the control section produces position information indicating a position of the fuse to be cut off in accordance with the leakage current cutoff information, and outputs the position information to a laser irradiation device.

In still another embodiment of the invention, the leakage current cutoff information includes information indicating the position of the fuse with respect to a predetermined point on a semiconductor chip on which the semiconductor device is formed as a reference point.

In still another embodiment of the invention, the semiconductor device is mounted on a system LSI.

In still another embodiment of the invention, the semiconductor device further includes a leakage current cutoff information storage section for storing the leakage current cutoff information.

In still another embodiment of the invention, the semiconductor device further includes a leakage current detection section for detecting whether a leakage current has occurred in at least one circuit block and producing the leakage current cutoff information based on a result of the detection.

In still another embodiment of the invention, at least one of the plurality of circuit blocks includes a defective element having a defect of failing to execute a predetermined operation, the semiconductor device further includes a redundant circuit section for prohibiting an access to the defective element and allowing for an access to a redundant element, and the control section controls the leakage current cutoff section in accordance with at least one of an address of the defective element and the leakage current cutoff information.

In still another embodiment of the invention, the semiconductor device further includes a system controller which receives mode information indicating either a first mode or a second mode, wherein the semiconductor device operates in the second mode with a lower power consumption than in the first mode, and controls the control section in accordance with the mode information.

In still another embodiment of the invention, at least one of the plurality of circuit blocks is a memory block including a plurality of memory cells.

According to another aspect of the present invention, a method for controlling a semiconductor device including an array section having a plurality of circuit blocks is provided. The method includes the step of: cutting off a leakage current occurring in at least one of the plurality of circuit blocks in the array section in accordance with leakage current cutoff information.

In one embodiment of the invention, the step of cutting off a leakage current includes the step of electrically insulating at least one of the plurality of circuit blocks from a power source which supplies electric power to the array section.

In another embodiment of the invention, the method further includes the step of storing the leakage current cutoff information.

In still another embodiment of the invention, the method further includes the steps of: detecting whether the leakage current has occurred in at least one circuit block; and producing the leakage current cutoff information based on a result of the detection.

Thus, the invention described herein makes possible the advantages of (1) providing a semiconductor device capable of reducing power consumption by eliminating (cutoff) a leakage current and a method for controlling such a semiconductor device, (2) providing a semiconductor device capable of controlling the elimination of the leakage current after the mounting of the semiconductor device (especially, after the incorporation of the semiconductor device in a product) and a method for controlling such a semiconductor device, and (3) providing a semiconductor device capable of controlling the elimination of the leakage current in accordance with an application type used in a system and the requirements of the application and a method for controlling such a semiconductor device.

These and other advantages of the present invention will become apparent to those skilled in the art upon reading and understanding the following detailed description with reference to the accompanying figures.

BRIEF DESCRIPTION OF THE DRAWINGS

FUG. 8 is a block diagram which illustrates a configuration of a semiconductor device of Example 5 according to the present invention.

DESCRIPTION OF THE PREFERRED EMBODIMENTS

First, the principle of the present invention will be described.

Figure 1:
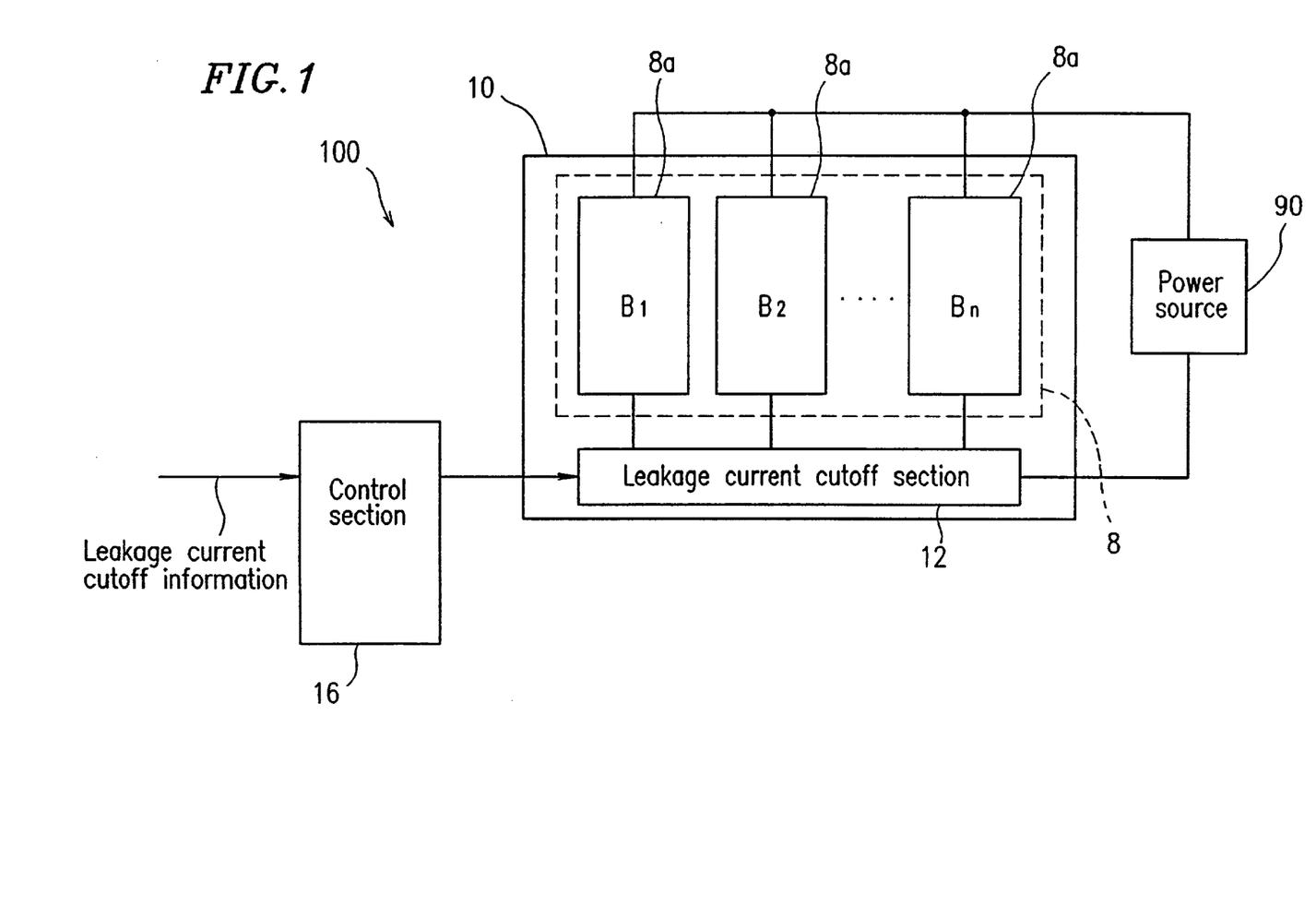
FIG. 1 is a block diagram which illustrates the principle of the present invention.

FIG. 1 illustrates a configuration of a semiconductor device 100 according to the present invention. The semiconductor device 100 includes an array section 8, a leakage current cutoff section 12 for cutting off a leakage current occurring in the array section 8, and a control section 16 for controlling the leakage current cutoff section 12 in accordance with leakage current cutoff information. The semiconductor device 100 may include one or more of the array section 8.

The array section 8 includes a plurality of circuit blocks 8a (i.e., circuit blocks $B_1$ to $B_n$ where n is an integer equal to 2 or more). Electric power is supplied to the plurality of circuit blocks 8a from a power source 90.

Each of the plurality of circuit blocks 8a may be a memory block including a plurality of memory cells. In the memory block, a leakage current may occur from a defective memory cell. For example, a leakage current may occur in such a defective memory cell due to a short circuit or floating gate caused by cutting. The "defective memory cell" as used herein is defined as a memory cell which fails to perform its essential function of storing a value of "0" or "1".

A leakage current may also occur from a normal memory cell. Thus, the "leakage current" as used herein includes a leakage current occurring from a normal memory cell, as well as a leakage current occurring from a defective memory cell.

In the following description, the leakage current is assumed to occur between the source potential of the power source 90 and the ground potential. However, the leakage current may occur, not only between the source potential and the ground potential, but also between any two different potentials. It should therefore be understood that the cutoff of a leakage current occurring between two different potentials based on the principle of the present invention is also included in the scope of the present invention.

The plurality of circuit blocks 8a are not restricted to the memory blocks as described above, but may be any arbitrary number or configuration of circuit blocks.

The leakage current cutoff section 12 cuts off a leakage current for every circuit block 8a individually by electrically insulating at least one of the plurality of circuit blocks 8a from the power source 90. In this illustrative example, one circuit block 8a is assumed to be the unit requiring the cutting off the leakage current. However, the unit for cutting off the leakage current is not restricted to the circuit block 8a. Instead, the leakage current cutoff section 12 may cut off a leakage current for a unit larger than the circuit block 8a (e.g., the unit of the array section 8 and the unit of the semiconductor chip 10), or a unit smaller than the circuit block 8a (e.g., the unit of a sub-block included in the circuit block 8a and the unit of a minimum element included in the circuit block 8a which can execute a specific function). The minimum element which can execute a specific function is a memory cell included in a memory block when the circuit block 8a is the memory block; while the minimum element is a logic gate (e.g., an AND gate and an OR gate) included in a logic circuit when the circuit block 8a is the logic circuit.

Figure 2A:
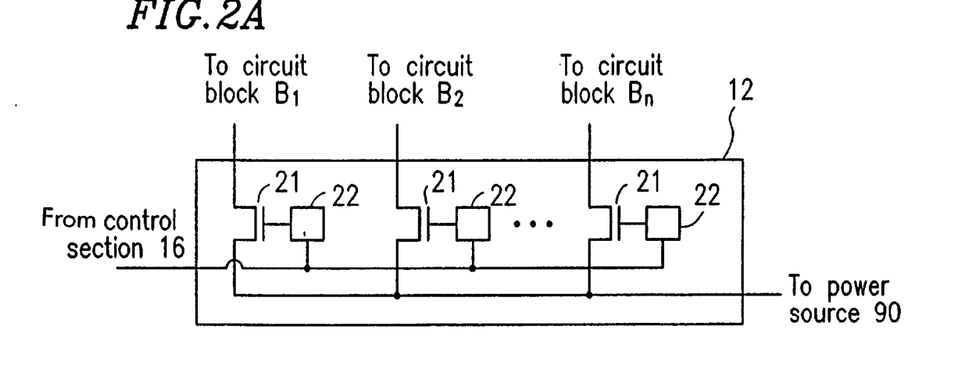
FIGS. 2A is a combined block diagram and schematic diagram which illustrates a configuration of a leakage current cutoff section according to the present invention, FIG. 2B schematically illustrates how a leakage current flows in a circuit block according to the present invention.

FIG. 2A illustrates a configuration of the leakage current cutoff section 12. The leakage current cutoff section 12 includes a plurality of switching elements 21 and a plurality of programmable logic elements 22. Each of the plurality of switching elements 21 is connected to the power source 90 and the corresponding one of the plurality of circuit blocks 8a. When the switching element 21 corresponding to a particular circuit block 8a is in the ON state, the power source 90 and the corresponding circuit block 8a are electrically connected with each other via the switching element 21, thereby allowing power to be supplied from the power source 90 to the circuit block 8a. When the switching element 21 is in the OFF state, the power source 90 and the circuit block 8a are electrically insulated from each other, thereby allowing a leakage current occurring in the circuit block 8a to be cut off. The ON/OFF switching of the switching element 21 is controlled by the corresponding programmable logic element 22.

A metal oxide semiconductor field-effect transistor (MOSFET), for example, may be used for the switching element 21. A static random access memory (SRAM), a non-volatile memory, a laser-blown type fuse ROM, and the like, for example, may be used for the programmable logic element 22. Since such a programmable logic element 22 can be realized by a relatively small-scale circuit, an addition of a large-scale circuit is not necessary to achieve the leakage current cutoff section 12. The gate electrode of the MOSFET as the switching element 21 is connected with the programmable logic element 22, so that the voltage applied to the gate electrode of the MOSFET is controlled based on information (i.e., a program result) written in the programmable logic element 22. Thus, the ON/OFF of the MOSFET is controlled.

Figure 2B:
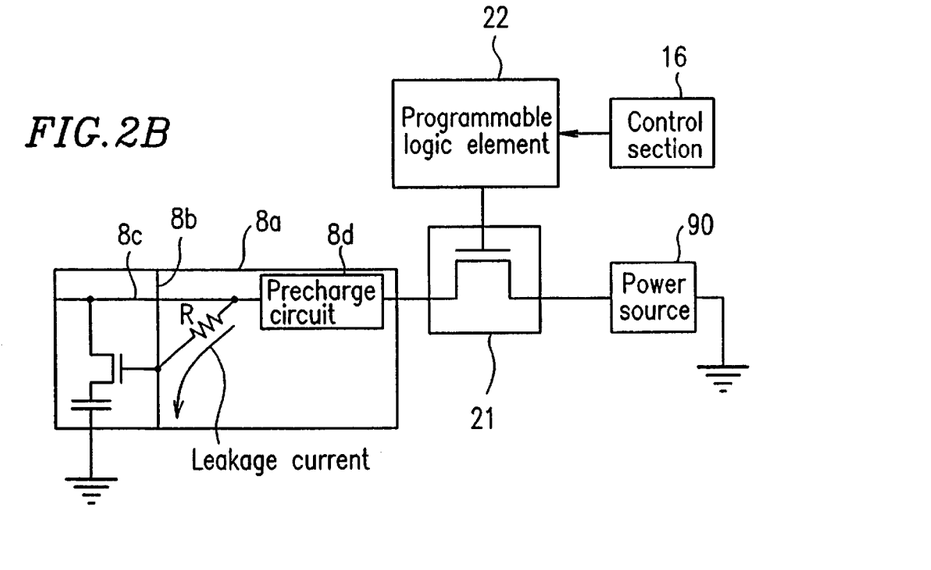

FIG. 2B schematically illustrates how a leakage current flows in the circuit block 8a. In this illustrative example, the circuit block 8a is assumed to be a memory block. In a standby state, a word line 8b is at a low voltage level while a bit line 8c is being precharged by a precharge circuit 8d. That is, the bit line 8c is electrically connected with the power source 90 which supplies a precharge voltage in the standby state. Under this state, therefore, if a short circuit occurs between the word line 8b and the bit line 8c, a leakage current flows from the bit line 8c to the word line 8b. Such a leakage current can be cut off by switching the switching element 21 to the OFF state as described above.

FIG. 2B illustrates an example where a leakage current is cut off for every memory cell individually for simplification. In practice, the leakage current should preferably be cut off for every two or more memory cells individually.

The control section 16 receives leakage current cutoff information. The leakage current cutoff information may be generated according to one example, by testing the device 100 to identify defective circuit blocks or a defective element within the circuit block. Such information may be stored inside the semiconductor device 100 so that the control section 16 can obtain the leakage current cutoff information by reading the information stored in the semiconductor device 100. Alternatively, the leakage current cutoff information may be input into the control section 16 from outside the semiconductor device 100.

The leakage current cutoff information includes identification information identifying at least one circuit block 8a which should be electrically insulated from the power source 90. For example, in the case where the array section 8 includes eight circuit blocks 8a (i.e., circuit blocks $B_1$ to $B_8$), the identification information may be represented by an eight-bit sequence with each bit having a value of either "0" or "1". The value "0" indicates that the corresponding circuit block 8a should not be electrically insulated from the power source 90. The value "1" indicates that the corresponding circuit block 8a should be electrically insulated from the power source 90. Thus, the identification information of a bit sequence "10100000", for example, indicates that circuit blocks $B_1$ and $B_3$ should be electrically insulated from the power source 90, while the circuit blocks $B_2$ and $B_4$ to $B_8$ should not be electrically insulated from the power source 90.

The control section 16 produces program information based on the identification information and outputs the program information to the leakage current cutoff section 12. The program information can be obtained by inverting the bit values of the identification information. For example, when the identification information is the bit sequence "10100000", the program information is a bit sequence "01011111". Such program information is used to program the programmable logic elements 22 of the leakage current cutoff section 12.

The identification information and the program information are not necessarily in an inverted relationship with each other. The identification information is logical information independent from the configuration of the leakage current cutoff section 12, while the program information is information dependent on the configuration of the leakage current cutoff section 12. Accordingly, as the configuration of the leakage current cutoff section 12 changes, the relationship between the identification information and the program information changes. For example, in the case where a PMOS transistor is used in place of the NMOS transistor for the switching element 21, the identification information and the program information are identical to each other.

Each bit value of the program information is written in the corresponding programmable logic element 22 of the leakage current cutoff section 12. When the bit value "0" is written in the programmable logic element 22, the corresponding switching element 21 is turned to the OFF state. This electrically insulates the circuit block 8a connected to the switching element 21 from the power source 90, and thus allows a leakage current occurring in the circuit block 8a to be cut off. When the bit value "1" is written in the programmable logic element 22, the corresponding switching element 21 is turned to the ON state. This electrically connects the circuit block 8a connected to the switching element 21 with the power source 90, and thus allows power to be supplied from the power source 90 to the circuit block 8a connected to the switching element 21.

At least one of the plurality of circuit blocks 8a can be selectively electrically insulated from the power source 90 by changing a bit value of the identification information included in the leakage current cutoff information. In this way, the unit for cutting off a leakage current can be controlled by software. This control is advantageous in that a leakage current can be cut off even when a leakage current occurs after the mounting of the semiconductor device 100 (especially after the incorporation of the semiconductor device 100 in a product).

The array section 8 including the plurality of circuit blocks 8a and the leakage current cutoff section 12 are preferably formed on the single semiconductor chip 10, though they may be formed on different semiconductor chips.

As described above, in the semiconductor device 100, a leakage current occurring in the array section 8 can be cut off for every circuit block 8a individually. This eliminates wasteful power consumption due to the leakage current. Moreover, since the leakage current cutoff section 12 is controlled by the control section 16, a leakage current occurring in the array section 8 after the mounting of the semiconductor device 100 can be cut off.

Hereinbelow, the present invention will be described by way of examples with reference to the accompanying drawings.

EXAMPLE 1

Figure 3:
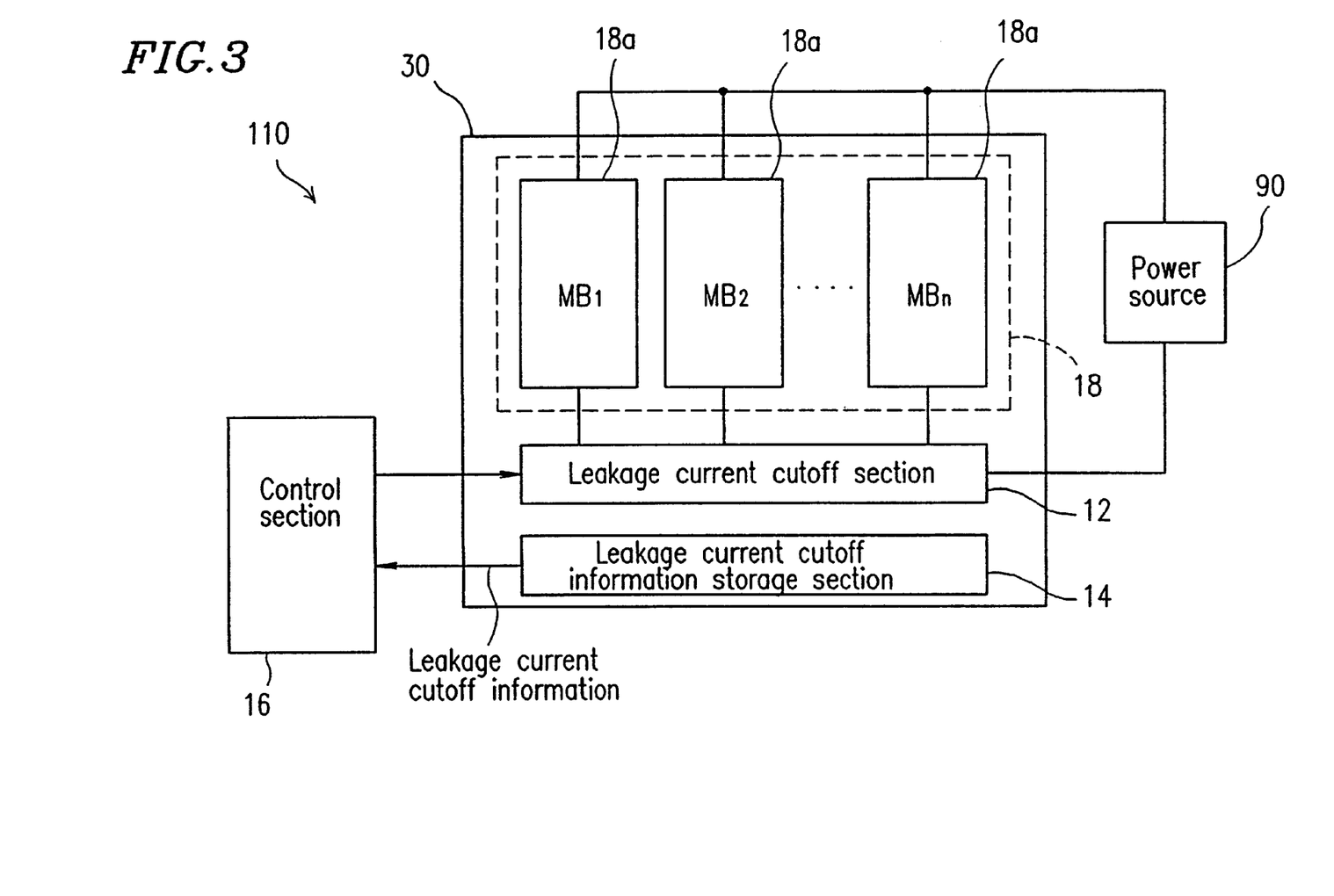
FIG. 3 is a block diagram which illustrates a configuration of a semiconductor device of Example 1 according to the present invention.

FIG. 3 illustrates a configuration of a semiconductor device 110 of Example 1 according to the present invention. The semiconductor device 110 is an example where the principle of the present invention described above is applied to a memory. In the semiconductor device 110, the leakage current cutoff information is stored in a leakage current cutoff information storage section 14.

The semiconductor device 110 includes a memory cell array 18, the leakage current cutoff section 12 for cutting off a leakage current occurring in the memory cell array 18, the control section 16 for controlling the leakage current cutoff section 12 in accordance with the leakage current cutoff information, and the leakage current cutoff information storage section 14. The semiconductor device 110 may includes two or more of the memory cell arrays 18.

The memory cell array 18 includes a plurality of memory blocks 18a (i.e., memory blocks $MB_1$ to $MB_n$ where n is an integer equal to 2 or more). Each of the plurality of memory blocks 18a includes a plurality of memory cells (not shown) and peripheral circuits (not shown) for the access to the plurality of memory cells. The peripheral circuits include a row decoder, a column decoder, a sense amplifier, and the like. Electric power is supplied to the plurality of memory blocks 18a from the power source 90.

The leakage current cutoff section 12, which is disposed between the power source 90 and the memory cell array 18, insulates any desired memory block 18a from the power source 90, so as to cut off a leakage current for every memory block 18a individually. The configuration of the leakage current cutoff section 12 is the same as that shown in FIG. 2A, and thus the description thereof is omitted here.

The control section 16 reads the leakage current cutoff information stored in the leakage current cutoff information storage section 14. The leakage current cutoff information includes identification information identifying any memory block 18a which may need to be electrically insulated from the power source 90. The control section 16 produces program information based on the identification information, and outputs the program information to the leakage current cutoff section 12. The program information is written in the programmable logic element 22 of the leakage current cutoff section 12 so that the ON/OFF of the corresponding switching element 21 can be controlled by the programmable logic element 22. When the switching element 21 is switched to the OFF state, a leakage current occurring in the memory block 18a connected to the switching element 21 is cut off.

The memory cell array 18 including the plurality of memory blocks 18a, the leakage current cutoff section 12, and the leakage current cutoff information storage section 14 are preferably formed on a single semiconductor chip 30, though they may be formed on different semiconductor chips.

As described above, in the semiconductor device 110, a leakage current occurring in the memory cell array section 18 can be cut off for every circuit block 18a individually. This eliminates wasteful power consumption due to the leakage current. Moreover, since the leakage current cutoff section 12 is controlled by the control section 16, a leakage current occurring in the memory cell array section 18 after the mounting of the semiconductor device 110 can be cut off.

EXAMPLE 2

Figure 4:
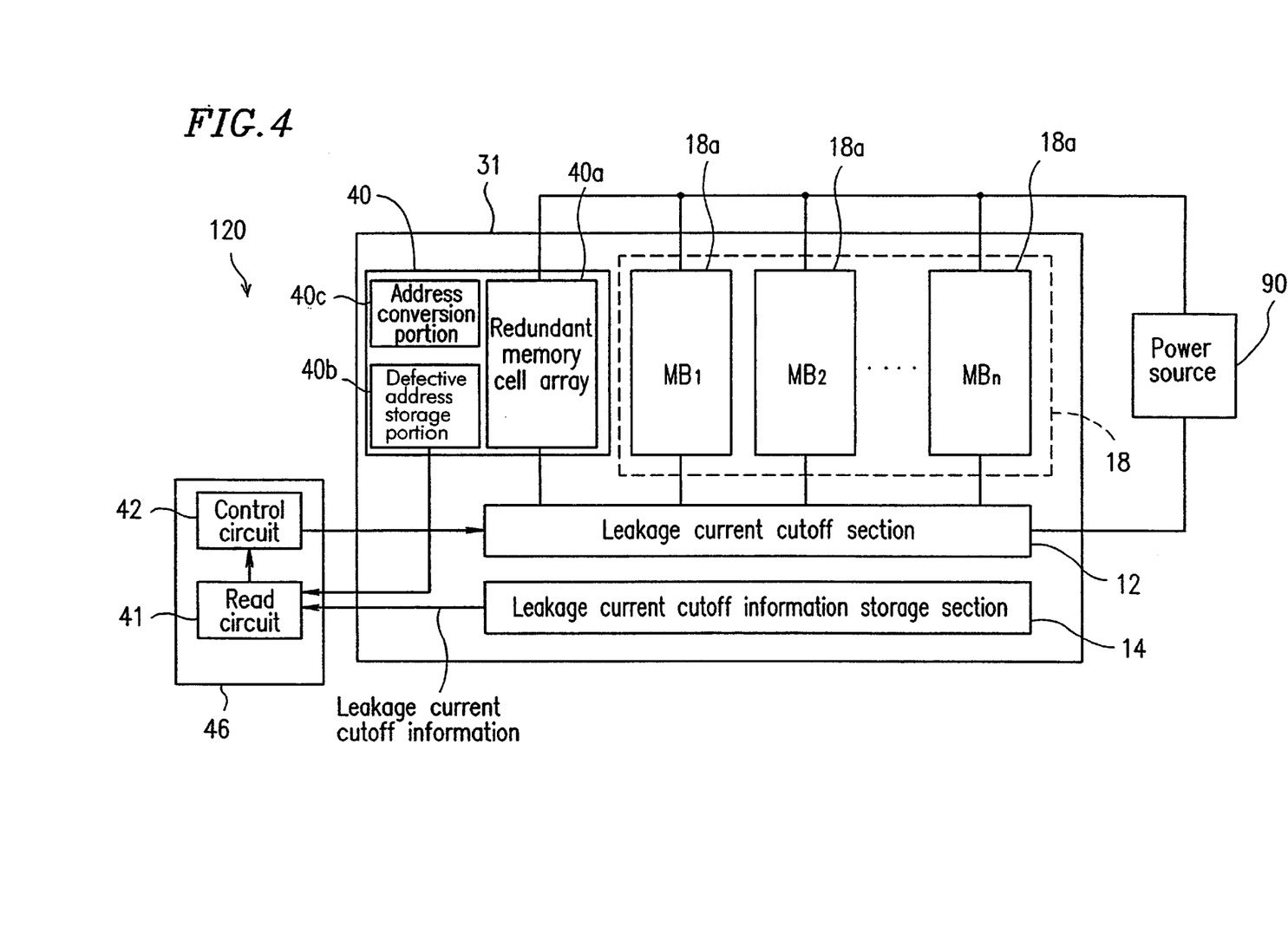
FIG. 4 is a block diagram which illustrates a configuration of a semiconductor device of Example 2 according to the present invention.

FIG. 4 illustrates a configuration of a semiconductor device 120 of Example 2 according to the present invention. In FIG. 4, the same components as those of the semiconductor device 110 shown in FIG. 3 are denoted by the same reference numerals, and the description thereof is omitted here. The semiconductor device 120 is an example where the principle of the present invention is applied to a memory and the memory employs the redundant circuit design. In this example, the address of a defective memory cell in the memory cell array 18 is used to identify the memory block 18a which should be insulated from the power source 90.

The semiconductor device 120 includes a redundant memory section 40 for compensating for a defective memory cell in the memory cell array 18. The redundant memory section 40 includes a redundant memory cell array 40a having a plurality of redundant memory cells, an address storage portion 40b for storing the address of a defective memory cell in the memory cell array 18, and an address conversion portion 40c for converting the address of the defective memory cell in the memory cell array 18 into an address of a redundant memory cell in the redundant memory cell array 40a.

The address storage portion 40b may be a ROM, for example, while the address conversion portion 40c may be a PROM, for example. The address conversion portion 40c decodes the address of a defective memory cell in accordance with a predetermined rule, and outputs an address of a redundant memory cell, thereby realizing the conversion of the defective memory cell into a redundant memory cell.

A control section 46 includes a read circuit 41 and a control circuit 42. The read circuit 41 reads the leakage current cutoff information stored in the leakage current cutoff information storage section 14 as well as the address of the defective memory cell stored in the address storage portion 40b. The leakage current cutoff information includes the identification information identifying at least one memory block 18a which should be electrically insulated from the power source 90 as described above.

A defective memory cell does not operate normally and thus causes a leakage current with a considerably high probability. Therefore, the memory block 18a including such a defective memory cell is preferably electrically insulated from the power source 90.

The control circuit 42 determines which one of the plurality of memory blocks $MB_1$ to $MB_n$ includes the defective memory cell based on the address of the defective memory cell. For example, assume that addresses $A_{k-1}$ to $A_k$ are allocated to the memory block $MB_k$ where k is an integer equal to or more than 1 and equal to or less than n, and that the address of the defective memory cell is a. If the relationship of $A_{k-1} \leq a \leq A_k$ is satisfied, the defective memory cell is included in the memory block $MB_k$. Since the control circuit 42 manages a memory map of the entire memory cell array 18, it can determine that the defective memory cell is included in the memory block $MB_k$.

For example, when the memory cell array 18 includes eight memory blocks 18a (i.e., memory blocks $MB_1$ to $MB_8$), the memory block $MB_k$ ($1 \leq k \leq 8$) including a defective memory cell can be identified by producing an eight-bit sequence. For example, a bit sequence "00010000" indicates that the memory block $MB_4$ includes a defective memory cell. Likewise, a bit sequence "00011000" indicates that the memory blocks $MB_4$ and $MB_5$ include a defective memory cell. In this way, the control circuit 42 produces information which indicates at least one memory block including a defective memory cell (hereinbelow, such information is called "defective memory cell information").

The control circuit 42 produces new identification information based on the identification information included in the leakage current cutoff information read from the leakage current cutoff information storage section 14 and the defective memory cell information produced based on the address of the defective memory cell. Such new identification information is produced by, for example, calculating the logical OR of the identification information and the defective memory cell information. For example, when the identification information is represented by a bit sequence "10100000" and the defective memory cell information is represented by a bit sequence "00011000", the bit sequence of the new identification information is "10111000", which indicates that the memory blocks $MB_4$ and $MB_5$, in addition to the memory blocks $MB_1$ and $MB_3$, should be electrically insulated from the power source 90. Thus, the memory blocks including a defective memory cell are specified as the memory blocks which should be electrically insulated from the power source 90.

The control circuit 42 produces program information based on the new identification information and outputs the program information to the leakage current cutoff section 12. The program information is written in the programmable logic elements 22 of the leakage current cutoff section 12 so that the ON/OFF of the corresponding switching elements 21 can be controlled by the programmable logic elements 22. When the switching element 21 is switched to the OFF state, a leakage current occurring in the memory block 18a connected to the switching element 21 is cut off.

Alternatively, the control circuit 42 may produce program information based only on the defective memory cell information produced based on the address of a defective memory cell. In this case, the identification information included in the leakage current cutoff information is not used, and thus the leakage current cutoff information storage section 14 can be omitted.

The memory cell array 18 including the plurality of memory blocks 18a, the redundant memory section 40, the leakage current cutoff section 12, and the leakage current cutoff information storage section 14 are preferably formed on a single semiconductor chip 31, though they may be formed on different semiconductor chips.

As described above, in the semiconductor device 120, a leakage current occurring in the memory cell array 18 can be cut off in response to the address of a defective memory cell. Conventionally, the address of a defective memory cell has been used only for switching the access to the defective memory cell to the access to a redundant memory cell. The semiconductor device 120 of this example is thus characterized in that the address of a defective memory cell is used to cut off a leakage current occurring in the memory cell array 18.

EXAMPLE 3

Figure 5:
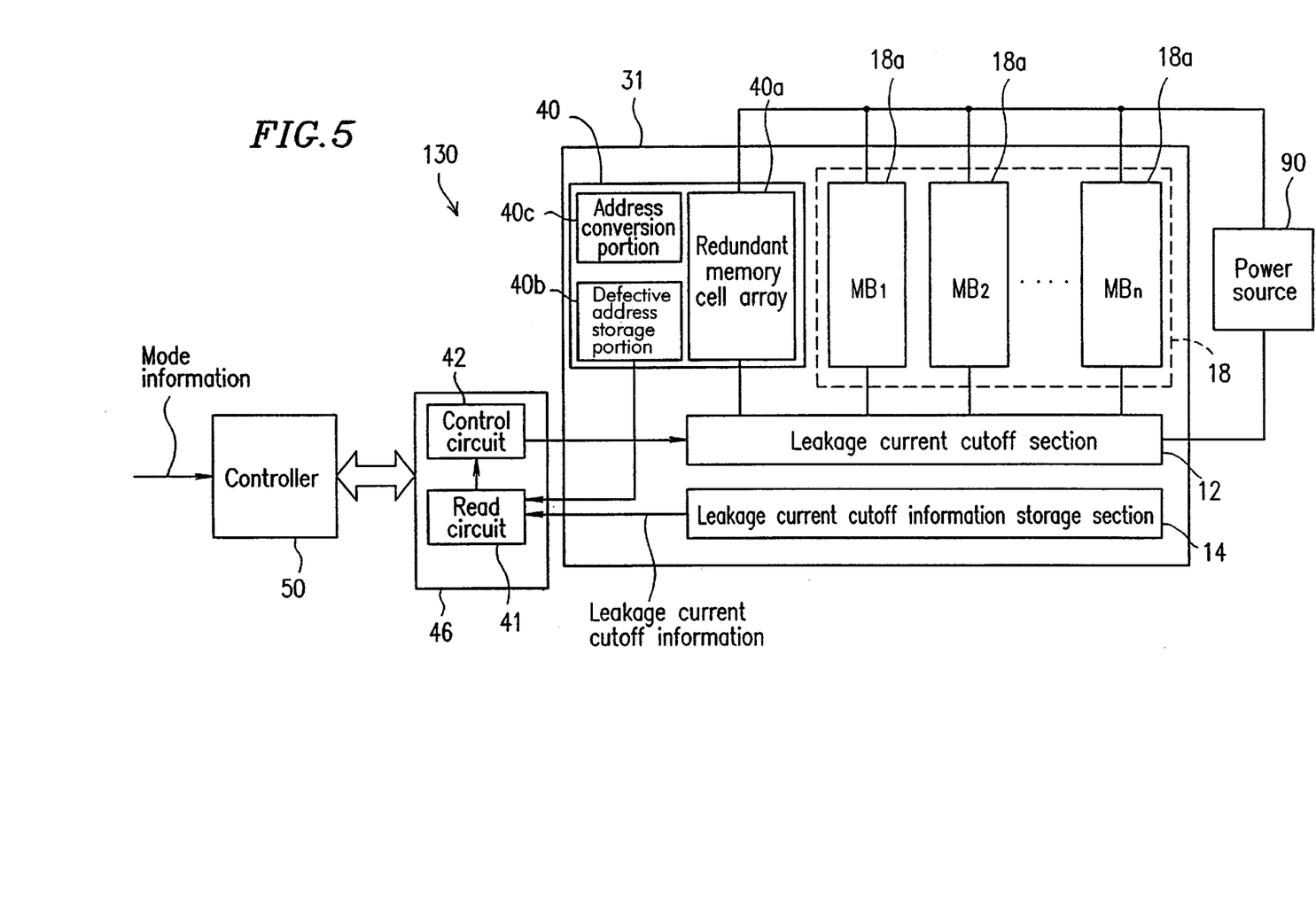
FIG. 5 is a block diagram which illustrates a configuration f a semiconductor device of Example 3 according to the present invention.

FIG. 5 illustrates a configuration of a semiconductor device 130 of Example 3 according to the present invention. In FIG. 5, the same components as those of the semiconductor device 120 shown in FIG. 4 are denoted by the same reference numerals, and the description thereof is omitted here. The semiconductor device 130 is an example where the principle of the present invention is applied to a memory. The semiconductor device 130 is used in a system such as a portable information apparatus. The system includes a controller 50 as well as the semiconductor device 130. The controller 50 not only controls the semiconductor device 130 but also controls all the other devices included in the system.

As in Example 2, the control circuit 42 produces new identification information based on the identification information included in the leakage current cutoff information read from the leakage current cutoff information storage section 14 and the defective memory cell information produced based on the address of a defective memory cell. The control circuit 42 sends the new identification information to the controller 50.

Mode information, which indicates either a normal mode or a power saving mode, is stored in the controller 50. In the power saving mode, the semiconductor device 130 is required to operate with a lower power consumption than in the normal mode. The power consumption is preferably as small as possible in the case where the system is a portable information apparatus or the like and the power source 90 is a secondary battery or the like. In such a case, the semiconductor device 130 is preferably operated in the power saving mode.

The controller 50 determines whether or not the new identification information sent from the control circuit 42 should be changed in accordance with the mode information.

In the power saving mode, priority is given to a low power consumption over a large memory capacity. For example, in the power saving mode, the controller 50 sends back the received new identification information to the control circuit 42 without any change. In this case, the operation of the semiconductor device 130 is substantially the same as that of the semiconductor device 120 of Example 2.

In the normal mode, priority is given to a large memory capacity over a low power consumption. For example, in the normal mode, the controller 50 changes at least part of the new identification information sent from the control circuit 42 and sends back the changed new identification information to the control circuit 42. When the new identification information sent from the control circuit 42 is a bit sequence "10111000", for example, the controller 50 may send back a bit sequence "10100000" to the control circuit 42 as changed new identification information. By this change of the new identification information, the number of memory blocks 18a to be electrically insulated from the power source 90 is reduced by one-half. Thus, the memory capacity is not substantially reduced though the power consumption increases due to the leakage current which has not been cut off.

Alternatively, the controller 50 may send back a bit sequence "00000000" to the control circuit 42 as changed new identification information regardless of the values of the new identification information sent from the control circuit 42. This indicates that the controller 50 instructs the control circuit 42 not to insulate any memory blocks 18a from the power source 90 regardless of the presence or absence of a leakage current. In this case, as in the above case, the memory capacity is not reduced though the power consumption increases due to the leakage current which has not been cut off.

The identification information included in the leakage current cutoff information or the defective memory cell information may be sent from the control circuit 42 to the controller 50 instead of the new identification information. In such a case, also, the controller 50 determines whether or not the identification information or the defective memory cell information should be changed.

The controller 50 may determine whether each of the memory blocks 18a of the memory cell array 18 should be used or electrically insulated from the power source 90 in accordance with the mode information, and produces identification information based on this determination. In this case, the control circuit 42 is not required to send the information to the controller 50. The identification information produced by the controller 50 is sent to the control circuit 42, which then produces program information based on the received identification information.

The mode information may be switched manually by the system operator or automatically in accordance with the type of the application used by the system and requirements of the application.

The controller 50 may determine which system priority should be given, a low power consumption or a large memory capacity, based on information other than the mode information as may be appreciated by those skilled in the art.

As described above, in the semiconductor device 130, whether or not a leakage current should be cut off is determined with the consideration that priority should be given to either a low power consumption or a large memory capacity. This makes it possible to control the semiconductor device 130 efficiently depending on the use status of the system.

EXAMPLE 4

In Example 4, the principle of the present invention is applied to at least one function block (IP) included in a system LSI.

Figure 6A:
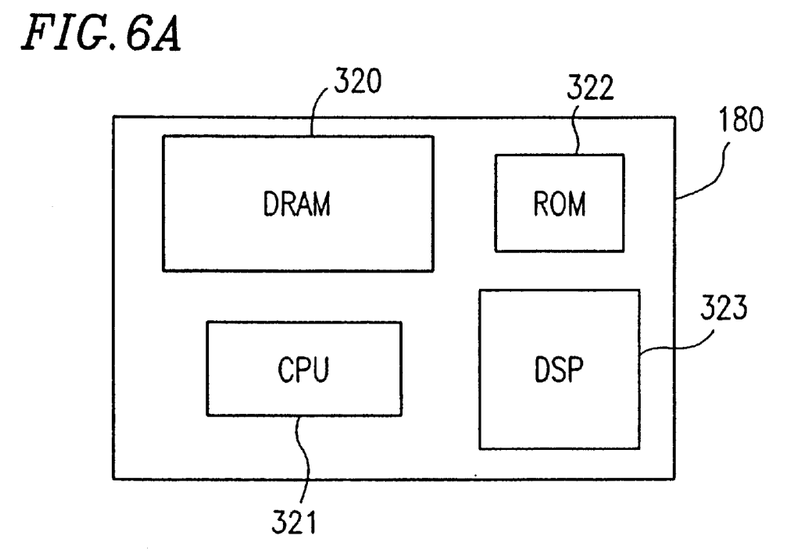
FIGS. 6A and 6B are block diagrams which illustrate configurations of a system LSI of Example 4 according to the present invention.

FIG. 6A illustrates a configuration of a system LSI 180. The system LSI 180 includes a function block 320 which executes the function of a DRAM, a function block 321 which executes the function of a CPU, a function block 322 which executes the function of a ROM, and a function block 323 which executes the function of a DSP.

Hereinbelow, an example where the principle of the present invention is applied to the function block 320 will be described. The principle of the present invention can also be applied to the function blocks 321 to 323.

Figure 7:
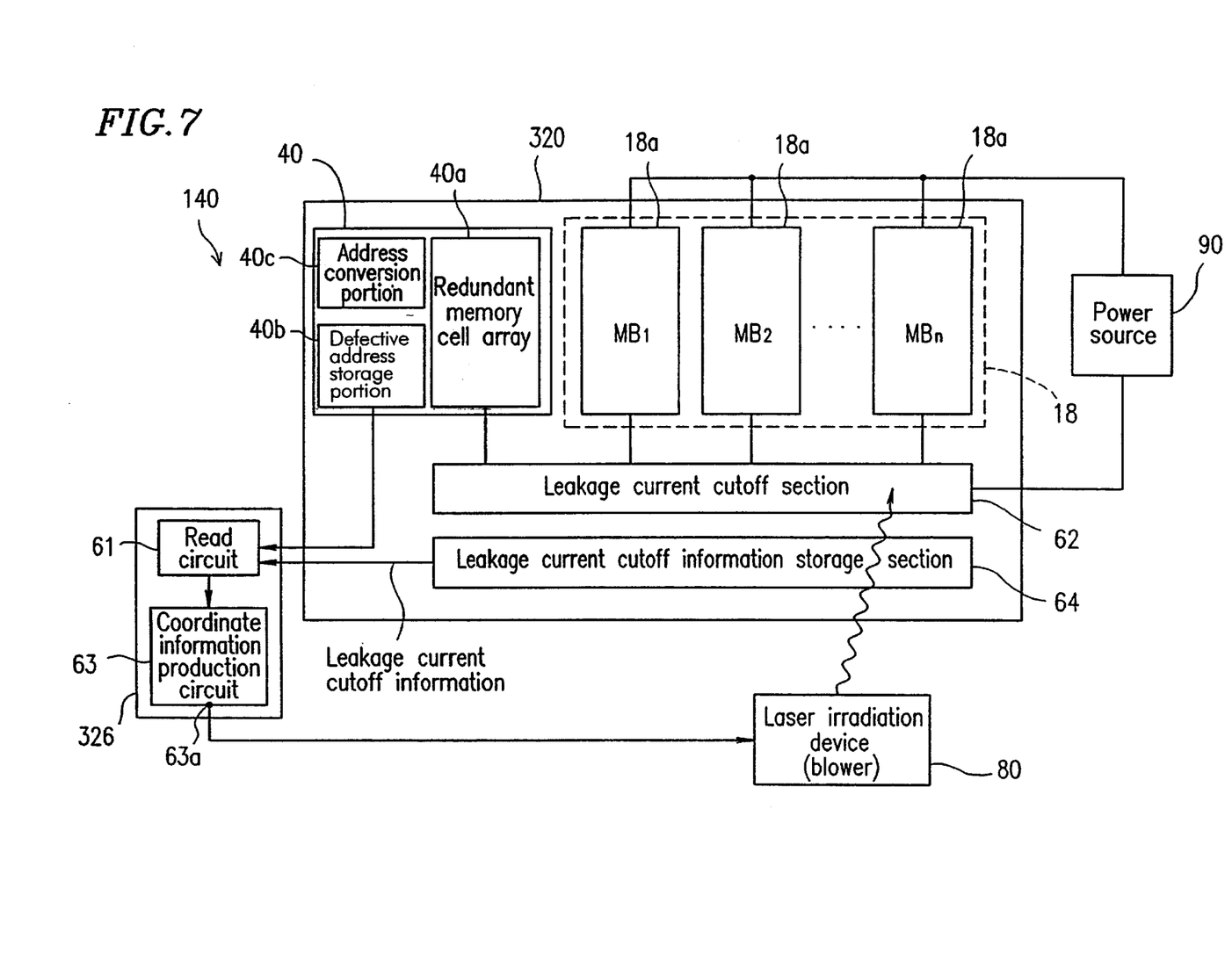
FIG. 7 is a block diagram which illustrates a configuration of a function block included in the system LSI of FIGS. 6A and 6B.

FIG. 7 illustrates a configuration of the function block 320, which includes a memory cell array 18, a leakage current cutoff section 62 for cutting off a leakage current occurring in the memory cell array 18, a leakage current cutoff information storage section 64 for storing leakage current cutoff information, and a redundant memory section 40. The function block 320 may include two or more of the memory cell arrays 18.

The configurations of the memory cell array 18 and the redundant memory section 40 are the same as those in Example 2, and thus the description thereof is omitted.

The leakage current cutoff section 62 is disposed between the power source 90 and the memory cell array 18, and insulates at least one of a plurality of memory blocks 18a from the power source 90, so as to cut off a leakage current for every memory block 18a individually.

Figure 2C:
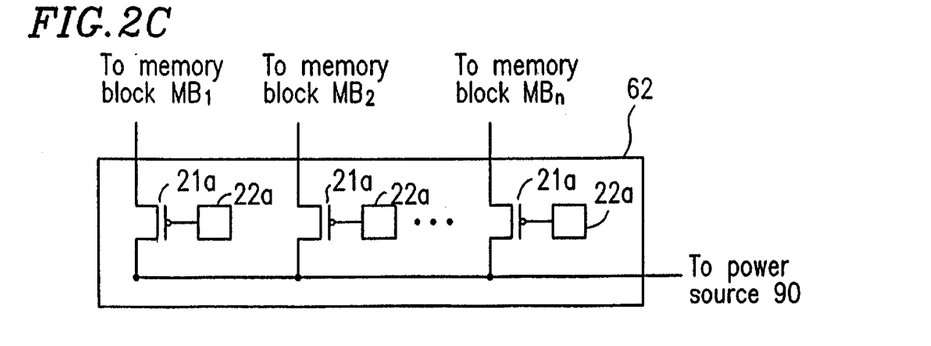
FIG. 2C is a combined block diagram and schematic diagram which illustrates a configuration of another leakage current cutoff section according to the present invention.

FIG. 2C illustrates a configuration of the leakage current cutoff section 62, which includes a plurality of PMOS transistors 21a serving as the switching elements and a plurality of laser-blown type fuse ROMs 22a serving as the programmable logic elements. The leakage current cutoff section 62 can be formed at low cost since the configuration thereof is simple.

The leakage current cutoff section 62 may have another configuration where a fuse is disposed between each of the plurality of memory blocks 18a and the power source 90. In this case, the PMOS transistors 21a can be omitted.

Each of the laser-blown type fuse ROMs 22a includes a fuse. When the fuse is melted by irradiation with a laser beam from a laser irradiation device 80, the potential at the terminal of the laser-blown type fuse ROM 22a becomes a high level. This turns the corresponding PMOS transistor 21a to the OFF state. As a result, a leakage current occurring in the memory block 18a connected to the PMOS transistor 21a is cut off.

A control section 326 includes a read circuit 61 and a coordinate information production circuit 63. The control section 326 may be disposed inside or outside the system LSI 180.

The read circuit 61 reads the leakage current cutoff information stored in the leakage current cutoff information storage section 64. The leakage current cutoff information includes relative coordinate information for the fuse of the laser-blown type fuse ROM 22a to be cut off. The relative coordinate information represents the relative coordinates of the fuse with respect to a predetermined reference point on the function block 320 on which the memory cell array 18 is formed.

Figure 6B:
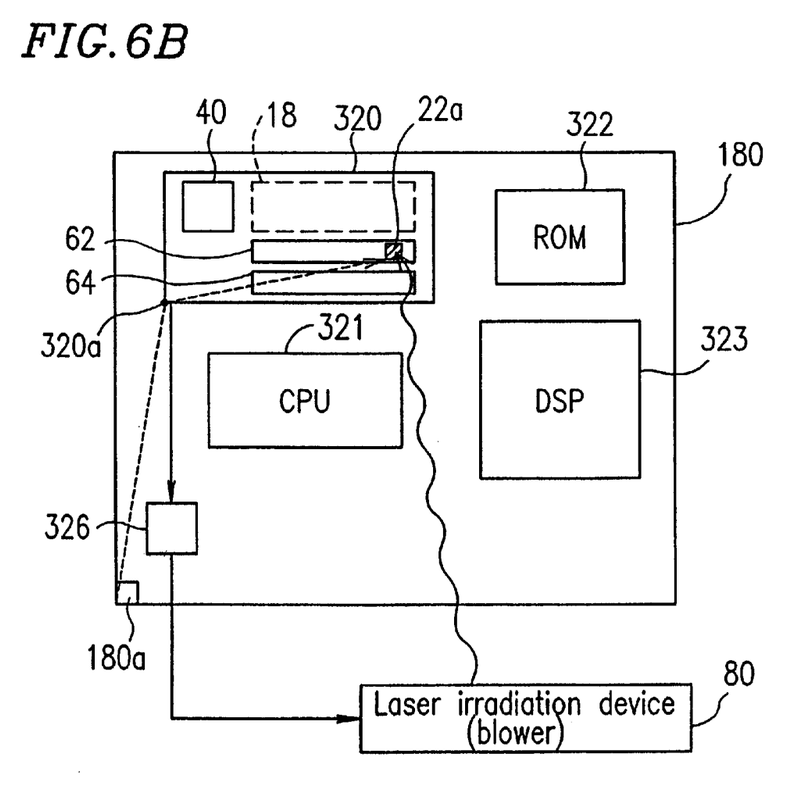

The coordinate information production circuit 63 converts the relative coordinate information into absolute coordinate information. The absolute coordinate information represents the absolute coordinates of the fuse with respect to a predetermined reference point on the system LSI 180 on which the function block 320 is mounted. For example, the absolute coordinate information (X, Y) are obtained by calculating formula 1 below.

$$(X, Y) = (a_1 + a_2, b_1 + b_2) \quad (1)$$

where, as shown in FIG. 6B, $(a_1, b_1)$ denotes the coordinates of the fuse of the laser-blown type fuse ROM 22a to be cut off with reference to a lower left corner point 320a of the function block 320 as a reference point, and $(a_2, b_2)$ denotes the coordinates of the lower left corner point 320a of the function block 320 with respect to an alignment key 180a of the system LSI 180 as a reference point.

Thus, the coordinates $(a_2, b_2)$ indicates an offset of the reference point of the function block 320 from the reference point of the system LSI 180. Hereinbelow, information indicating the offset of the reference point of the function block 320 from the reference point of the system LSI 180 is referred to as "offset information". The offset information is stored in advance in the coordinate information production circuit 63.

When the leakage current cutoff section 62 is disposed in a function block other than the function block 320 (e.g., in the function block 321), it is necessary to provide a control section for controlling this function block and store in advance the offset information for this function block in a coordinate information production circuit included in the control section.

The function blocks 320 to 323 which are mounted on the system LSI 180 are not necessarily designed by the same manufacturer and may be designed by different manufacturers. Accordingly, it is significantly useful for the coordinate information production circuit 63 to have the coordinate conversion function as described above.

The resultant absolute coordinate information is output to the laser irradiation device 80 via a terminal 63a. The laser irradiation device 80 is a conventional laser beam spot irradiation device having a high-precision position control function.

The laser irradiation device 80 allows the position defined by the absolute coordinate information to be irradiated with a laser beam, so as to cut the fuse of the laser-blown type fuse ROM 22a. As a result, the PMOS transistor 21a connected with the laser-blown type fuse ROM 22a is turned to the OFF state, thereby cutting off the leakage current.

The read circuit 61 also reads the address of a defective memory cell stored in the address storage portion 40b of the redundant memory section 40. A table for converting the address of a defective memory cell into relative coordinate information is stored in advance in the coordinate information production circuit 63. The coordinate information production circuit 63 converts the address of the defective memory cell into relative coordinate information by referring to the table. The coordinate information production circuit 63 then produces absolute coordinate information based on the relative coordinate information obtained by converting the address of the defective memory cell and the relative coordinate information read from the leakage current cutoff information storage section 64. Alternatively, the coordinate information production circuit 63 may produce absolute coordinate information only based on the relative coordinate information obtained by converting the address of the defective memory cell.

Thus, the control section 326 produces absolute coordinate information based on at least one of the address of the defective memory cell and the leakage current cutoff information, and outputs the absolute coordinate information to the laser irradiation device 80.

As described above, in the function block 320, a leakage current occurring in the memory cell array 18 can be cut off for every memory block 18a individually. This eliminates wasteful power consumption due to the leakage current. Moreover, the memory block 18a where a leakage current has occurred can be permanently cut off by cutting the fuse of the corresponding laser-blown type fuse ROM 22a.

If only a function block having the same function as the function block 320 is formed on a single semiconductor chip, the position of the fuse to be cut can be identified solely by the relative coordinate information. It is not necessary, therefore, to store the offset information in the coordinate information production circuit 63. The coordinate information production circuit 63 then outputs the relative coordinate information to the laser irradiation device 80 without converting the relative coordinate information into absolute coordinate information.

EXAMPLE 5

Figure 8:
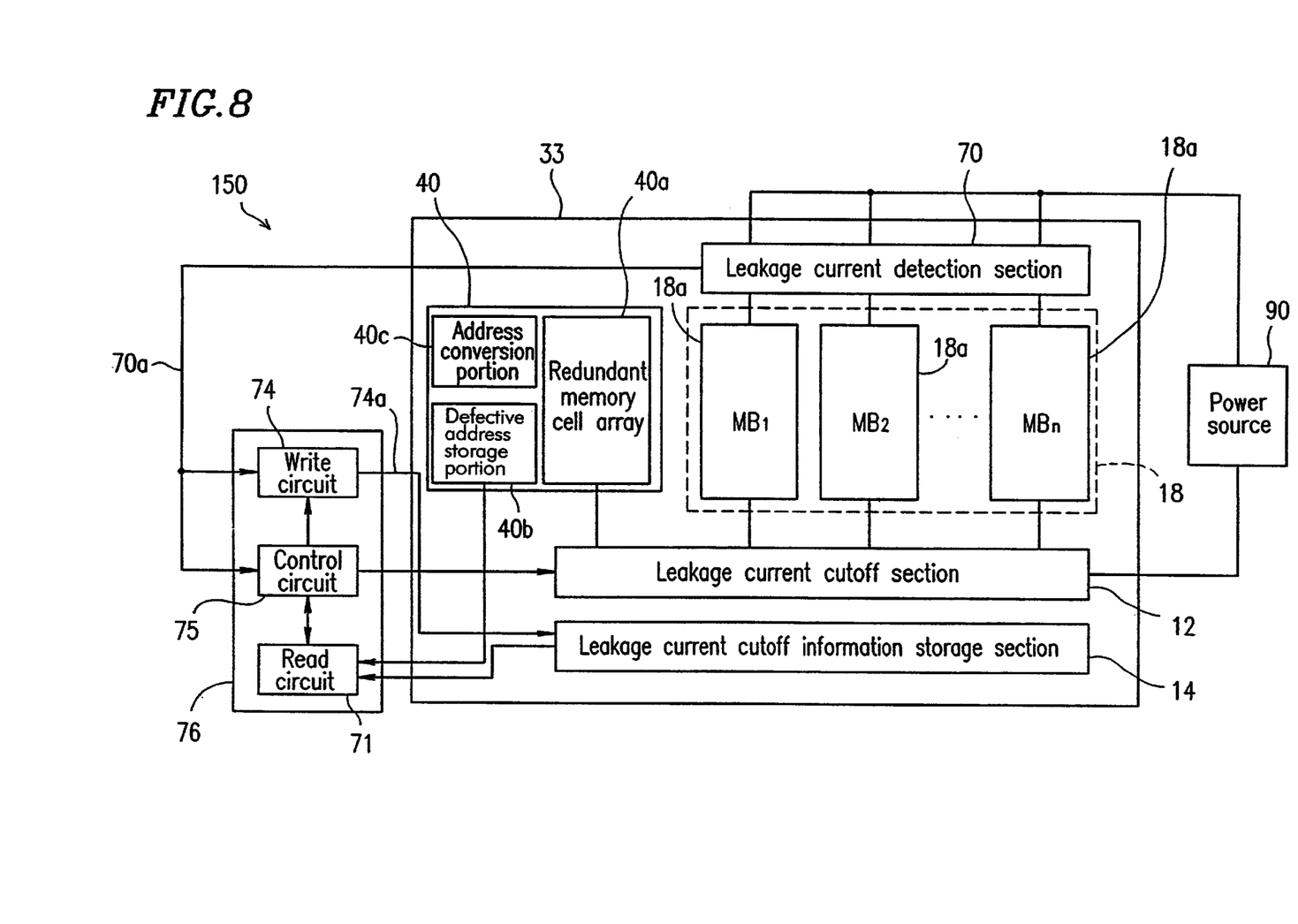

FIG. 8 illustrates a configuration of a semiconductor device 150 of Example 5 according to the present invention.

In FIG. 8, the same components as those of the semiconductor device 120 shown in FIG. 4 are denoted by the same reference numerals, and the description thereof is omitted here. The semiconductor device 150 is an example where the principle of the present invention is applied to a memory. The semiconductor device 150 includes a leakage current detection section 70 for detecting whether or not a leakage current has occurred in the memory cell array 18 for every memory block 18a individually.

The leakage current detection section 70 is disposed between the power source 90 and the memory cell array 18, and includes a plurality of current detection circuits which respectively correspond to the plurality of memory blocks 18a. The current detection circuits may have a known configuration where a predetermined voltage is output when a current exceeding a predetermined value flows.

The leakage current detection section 70 outputs a detection result 70a indicating whether or not a leakage current has occurred. For example, in the case where the memory cell array 18 includes eight memory blocks 18a (i.e., memory blocks $MB_1$ to $MB_8$), the detection result 70a may be represented by an eight-bit sequence with each bit having a value of either "0" or "1". The value "0" indicates that a leakage current has not occurred in the corresponding memory block 18a. The value "1" indicates that a leakage current has occurred in the corresponding memory block 18a. Thus, the detection result 70a of a bit sequence "10100000", for example, indicates that a leakage current has occurred in the memory blocks $MB_1$ and $MB_3$.

A control section 76 includes a write circuit 74, a control circuit 75, and a read circuit 71.

The write circuit 74 produces identification information 74a included in the leakage current cutoff information based on the detection result 70a and transmits the identification information 74a to the leakage current cutoff information storage section 14. When the leakage current cutoff information storage section 14 has already stored identification information, the stored identification information is renewed with the identification information 74a. The identification information 74a may be the same as the detection result 70a. In this case, the memory block or blocks 18a where a leakage current has occurred are the same as the memory block or blocks 18a which should already be electrically insulated from the power source 90. Alternatively, some change may be made to the detection result 70a to obtain the identification information 74a.

The operations of the control circuit 75 and the read circuit 71 are the same as those of the control circuit 42 and the read circuit 41 described in Example 2, and thus the description thereof is omitted here.

In the above description, the identification information 74a is first stored in the leakage current cutoff information storage section 14. However, the control circuit 75 may produce program information based on the identification information 74a without storing the identification information 74a in the leakage current cutoff information storage section 14. Alternatively, the control circuit 75 may produce program information directly based on the detection result 70a. The program information is written in the programmable logic elements 22 of the leakage current cutoff section 12. Thus, the ON/OFF state of the switching elements 21 connected with the programmable logic elements 22 is controlled. By turning the switching element 21 to the OFF state, a leakage current which has occurred in the memory block 18a connected to the switching element 21 can be cut off.

In the semiconductor device 150, the memory cell array 18 including the plurality of memory blocks 18a, the redundant memory section 40, the leakage current cutoff section 12, and the leakage current cutoff information storage section 14 are preferably formed on a single semiconductor chip 33, though they may be formed on different semiconductor chips.

The leakage current detection section 70 may be formed together with a tester in the tester mounting method described above, to share a detection circuit when the device is turned on.

As described above, the semiconductor device 150 is provided with the leakage current detection section 70 which can detect whether or not a leakage current is actually flowing in the memory cell array 18 even after the mounting of the semiconductor device 150. Accordingly, in the semiconductor device 150, whether or not a leakage current is present can be monitored when required (e.g., at the start of the operation of the semiconductor device 150), to cut off the leakage current based on the monitoring result. This cutoff of a leakage current is also possible even when a leakage current newly occurs due to a change over time after the mounting of the semiconductor device 150.

This example may be combined with Example 4. It would be easily understood by those skilled in the art that the semiconductor device 150 may be modified so that a leakage current is cut off by cutting a fuse included in the leakage current cutoff section using the laser irradiation device 80.

EXAMPLE 6

Figure 9:
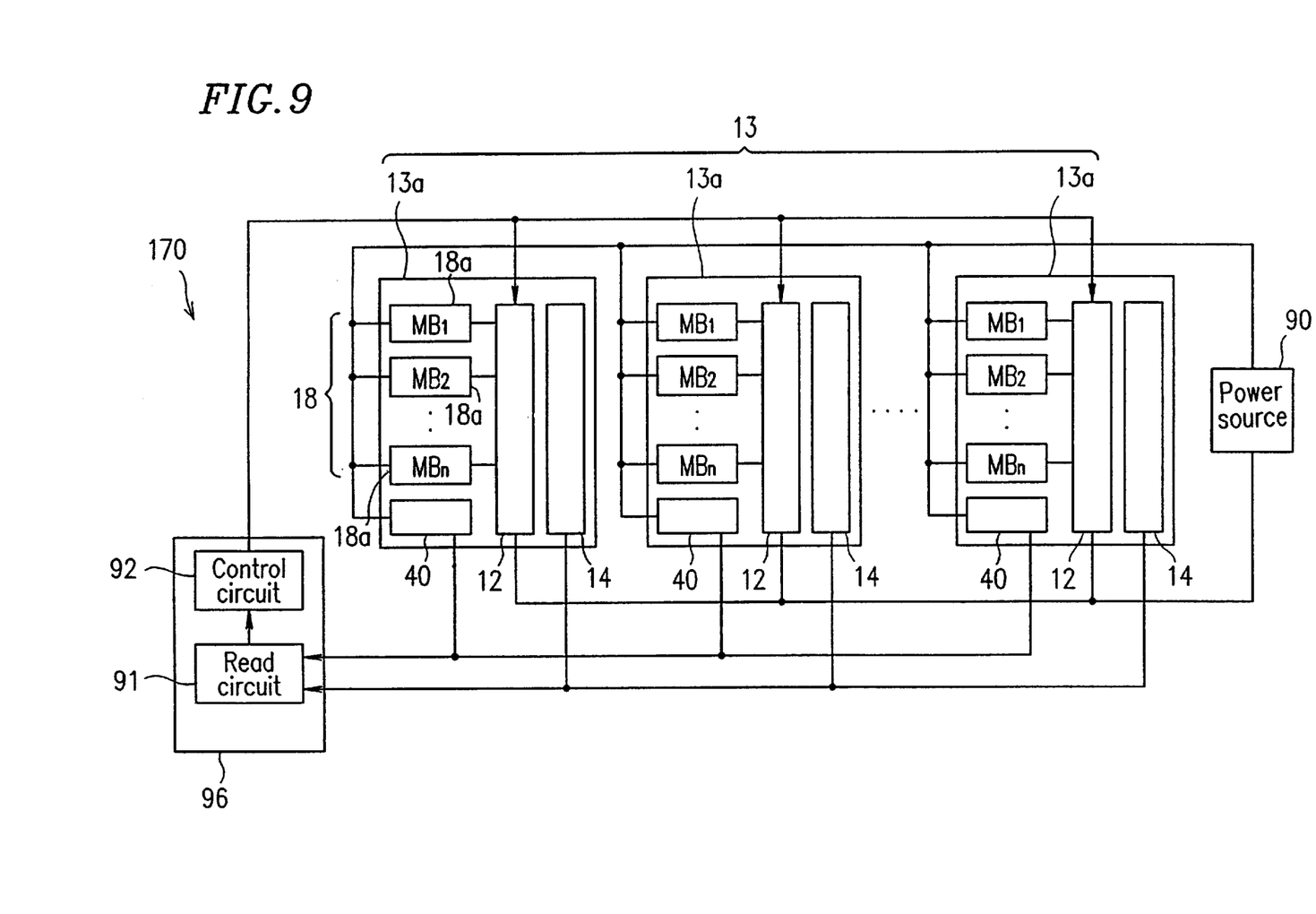
FIG. 9 is a combined block diagram and schematic diagram which illustrates a configuration of a semiconductor device of Example 6 according to the present invention.

FIG. 9 illustrates a configuration of a semiconductor device 170 of Example 6 according to the present invention. The semiconductor device 170 includes a memory section 13 and a control section 96 for controlling the memory section 13.

The memory section 13 includes a plurality of semiconductor chips 13a. The semiconductor chips 13a may be any of the semiconductor chips 10, 30, 31, and 33 described in the above examples. In this example, the semiconductor chip 31 shown in FIG. 4 is used for the plurality of semiconductor chips 13a.

The memory cell array 18 including the plurality of memory blocks 18a, the redundant memory section 40, the leakage current cutoff section 12, and the leakage current cutoff information storage section 14 are formed on each of the semiconductor chips 13a. The configurations of these sections are as described in Example 2.

The control section 96 includes a read circuit 91 and a control circuit 92. The read circuit 91 reads the leakage current cutoff information and the address of a defective memory cell respectively from the leakage current cutoff information storage section 14 and the redundant memory section 40 of each of the plurality of semiconductor chips 13a. The control circuit 92 determines the memory block 18a which should be electrically insulated from the power source 90 for every semiconductor chip 13a based on the information received from the read circuit 91, and controls the leakage current cutoff section 12 of the corresponding semiconductor chip 13a to electrically insulate the memory block 18a from the power source 90. No power is thus supplied to the memory block 18a of the semiconductor chip 13a, so that the leakage current in the memory block 18a is cut off.

Alternatively, the control section 96 can cut off a leakage current for each semiconductor chip 13a individually, instead of for every memory block 18a individually. For example, in the case where leakage currents occur in a number of memory blocks 18a in one of the semiconductor chips 13a, the control section 96 may electrically insulate the entire semiconductor chip 13a from the power source 90, so as to cut off the leakage currents for every semiconductor chip 13a individually.

Thus, in the semiconductor device 170, a leakage current may be cut off for every memory block 18a in each semiconductor chip 13a individually, or for every semiconductor chip 13a individually.

The staged cutoff (block 18a or chip 13a) of a leakage current as described above can also be applied to the other examples according to the present invention. For example, each memory block 18a may be divided into a plurality of portions (sub-blocks including a predetermined number of memory cells) and the corresponding switching element 21 may be configured to have a staged structure. For example, a first stage of the switching element 21 may cut off a leakage current for every subblock, while a second stage of the switching element 21 may cut off a leakage current for every memory block 18a (i.e., for the plurality of sub-blocks at one time).

Information on the staged structure of the switching elements 21 and the corresponding configuration of the programmable logic elements 22 can be stored in the leakage current cutoff information storage section 14 as control information. The read circuit 91 of the control section 96 reads the necessary information from each semiconductor chip 13a, and the control circuit 92 controls the leakage current cutoff section 12 of each semiconductor chip 13a depending on the configurations of the switching elements 21 and the programmable logic elements 22 of the semiconductor chip 13a.

In the above example, the plurality of semiconductor chips 13a are identical to one another. The present invention is not restricted to this configuration, but the semiconductor chips 13a may be of different types. The semiconductor chips 13a of different types may include different types of leakage current cutoff sections 12. For example, the configurations of the switching elements 21 and the types of the programmable logic elements 22 may be different from one another. Information representing the structure of the memory cell array 18, the configuration of the unit for cutting off a leakage current, the configuration of the switching elements 21, and the type of the programmable logic elements 22 may be stored in the leakage current cutoff information storage section 14 as the leakage current cutoff information or the control information, so that the memory section 13 can include various types of semiconductor chips 13a having different standards and formats.

Thus, in the semiconductor device 170, a leakage current can be effectively cut off even when the memory section 13 includes a plurality of semiconductor chips of different types.

As described above, in the semiconductor device and the method for controlling the semiconductor device according to the present invention, power consumption can be reduced by cutting off a leakage current. The leakage current can be controlled after the mounting of the semiconductor device (especially, after the incorporation of the semiconductor device in a product). Moreover, the cutoff of the leakage current can be controlled in accordance with the type of an application used in a system and the requirements of the application. The leakage current can also be effectively cut off even when the memory section includes a plurality of different semiconductor chips.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for controlling a semiconductor device including an array section having a plurality of circuit blocks, the semiconductor device operating in a second mode with a lower power consumption than in a first mode, the method comprising the steps of:
   receiving mode information indicating either the first mode or the second mode;
   controlling a control section in accordance with the mode information; and
   cutting off a leakage current occurring in at least one of the plurality of circuit blocks in the array section in accordance with leakage current cutoff information,
   wherein the step of cutting off a leakage current is performed by a leakage current cutoff section which is coupled to both (1) the array section which includes the plurality of circuit blocks, and (2) the control section for controlling the leakage current cutoff section in accordance with leakage current cutoff information.

2. A method according to claim 1, wherein the step of cutting off a leakage current comprises the step of electrically insulating at least one of the plurality of circuit blocks from a power source which supplies electric power to the array section.

3. A method according to claim 1, further comprising the step of storing the leakage current cutoff information.

4. A method according to claim 1, further comprising the steps of: detecting whether the leakage current has occurred in at least one circuit block; and producing the leakage current cutoff information based on a result of the detection.

5. A method for controlling a semiconductor device including an array section having a plurality of circuit blocks, the method comprising the step of:
   cutting off a leakage current occurring in at least one of the plurality of circuit blocks in the array section in accordance with leakage current cutoff information,
   wherein the step of cutting off a leakage current is performed by a leakage current cutoff section which is coupled to both (1) the array section which includes the plurality of circuit blocks, and (2) a control section for controlling the leakage current cutoff section in accordance with leakage current cutoff information, and
   wherein the leakage current cutoff section includes:
      a switching element disposed between a power source which supplies electric power to the array section and one of the plurality of circuit blocks; and
      a programmable logic element connected to the switching element, the control section controls an ON/OFF state of the switching element by programming the programmable logic element in accordance with the leakage current cutoff information.

6. A method according to claim 5, further comprising the step of storing the leakage current cutoff information.

7. A method according to claim 5, further comprising the steps of: detecting whether the leakage current has occurred in at least one circuit block; and producing the leakage current cutoff information based on a result of the detection.

8. A method according to claim 5, wherein the step of cutting off a leakage current comprises the step of electrically insulating at least one of the plurality of circuit blocks from the power source which supplies electric power to the array section.

9. A method for controlling a semiconductor device including an array section having a plurality of circuit blocks, the method comprising the step of:

cutting off a leakage current occurring in at least one of the plurality of circuit blocks in the array section in accordance with leakage current cutoff information, wherein the step of cutting off a leakage current is performed by a leakage current cutoff section which is coupled to both (1) the array section which includes the plurality of circuit blocks, and (2) a control section for controlling the leakage current cutoff section in accordance with leakage current cutoff information, and wherein the leakage current cutoff section includes:

a fuse disposed between a power source which supplies electric power to the array section and one of the plurality of circuit blocks; and the control section produces position information indicating a position of the fuse to be cut off in accordance with the leakage current cutoff information, and outputs the position information to a laser irradiation device.

10. A method according to claim 9, further comprising the step of storing the leakage current cutoff information.

11. A method according to claim 9, further comprising the steps of: detecting whether the leakage current has occurred in at least one circuit block; and producing the leakage current cutoff information based on a result of the detection.

12. A method according to claim 9, wherein the step of cutting off a leakage current comprises the step of electrically insulating at least one of the plurality of circuit blocks from the power source which supplies electric power to the array section.

* * * * *